(12) United States Patent
Harberts et al.

(10) Patent No.: US 6,897,799 B1
(45) Date of Patent: May 24, 2005

(54) CURRENT PARKING RETURN TO ZERO DIGITAL-TO-ANALOG CONVERTER

(75) Inventors: Harry S. Harberts, San Marcos, CA (US); Jeffrey M. Hinrichs, San Diego, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/897,240

(22) Filed: Jul. 22, 2004

(51) Int. Cl.[7] .................................. H03M 1/66
(52) U.S. Cl. ................ 341/144; 341/59; 341/136
(58) Field of Search ........................ 341/144, 136, 341/145, 161

(56) References Cited

U.S. PATENT DOCUMENTS 5,455,836 A * 10/1995 Li et al. ................. 372/25
5,739,783 A * 4/1998 Tajima .................. 341/59

* cited by examiner

Primary Examiner—Don Le
Assistant Examiner—Lam T. Mai
(74) Attorney, Agent, or Firm—Noel F. Heal

(57) ABSTRACT

A digital-to-analog converter having a differential signal path, and a current parking circuit that is independent of the signal path, thereby avoiding a source of imbalance that caused output anomalies in conventional digital-to-analog circuitry. In one embodiment of the invention, a pair of diodes in the current parking circuit are connected through their own independent load resistors to a voltage source. In another embodiment, a single diode is used instead of the pair of diodes, and in a third embodiment the current parking circuit comprises a single load resistor connected to the voltage source, and no diodes at all.

13 Claims, 4 Drawing Sheets

CURRENT PARKING RETURN TO ZERO DIGITAL-TO-ANALOG CONVERTER

BACKGROUND OF THE INVENTION

This invention relates generally to digital-to-analog (D/A) converters and, more particularly, to data converters of the type known as one-bit return-to-zero D/A converters. Conversion of data from digital to analog form is needed in a wide variety of electronic equipment, such as communication systems, which use digital processing internally but must usually communicate with the outside world in analog form. For example, digital recording and playback systems have a need to convert digital data retrieved from a recording medium to analog signals for output to loudspeakers or earphones.

The one-bit return-to-zero D/A converter is used in a variety of these applications. The term "one-bit" refers, of course, to the ability of the converter to convert one bit of digital data to analog form. It may seem at first that a one-bit D/A converter would have limited utility since it can provide an analog output with just two possible states. However, the one-bit D/A converter is an extremely useful "building block" in the design of more powerful D/A converters. When used to process the digital output from a modulator known as a delta-sigma modulator, the one-bit D/A converter provides a two-state analog output, which, when averaged over time, accurately reflects the value of a multi-bit input signal to the delta-sigma modulator. Thus, when used in association with a delta-sigma modulator, the one-bit D/A converter provides an output that, when smoothed by appropriate filtering, reflects the value of the multi-bit input signal. In a slightly different context, an N-bit D/A converter can be configured by summing the output currents from multiple ($2^N-1$) individual one-bit converters. This configuration is often referred to as a "unit element" D/A converter.

In one important application area, one-bit DACs are of interest to those involved in developing so-called "software" radio systems, which are easily reconfigurable communication systems that use digital signal processing for the most part. To reduce the proportion of analog circuitry in these systems, it is desirable to position the necessary data converters as close as possible to the radio antennas. High-speed one-bit return-to-zero D/A converters are key elements in the design of such radio systems.

An important reason for designers to use one-bit D/A converters is their inherent simplicity compared with conventional current summing D/A converters. More traditional D/A converters rely on summing of currents representative of contributions from each of the digital input bit positions, but this approach requires the use of a summing network of matched resistors. Because the one-bit D/A converter uses no analog components at all, it is not only cheaper but is inherently linear and, therefore, more accurate than current summing converters.

The term "return-to-zero" refers to a basic type of D/A converter in which the output signal returns to a zero value before assuming a new analog value reflective of the digital input state at the next digital input clock cycle. In a one-bit D/A converter of typical design, a constant current source is switched between an enabled state in which current is routed along one of two paths, as determined by the input data state, and a current "parking" state in which the current is routed along an alternate path that results in a zero output signal. The present invention is concerned with eliminating output inaccuracies that can result from the way in which a one-bit differential return-to-zero (RTZ) D/A converter is typically implemented.

As described in more detail below, the one-bit D/A converter is configured to include a constant current source switched by clock signals between the enabled state and the current parking state. When in the enabled state, the current is switched by differential digital input signals through one of two parallel paths, resulting in generation of differential output signals corresponding to the input signals. The output signals are also differential, in the sense that, in most applications, a processing module downstream of the D/A converter uses the difference between the output signals as the output value. In the current parking state, the current is diverted through two parallel paths, through diodes (or transistors configured as diodes), resulting in two equal voltages being impressed on the differential outputs, and consequently providing a zero differential output.

Unfortunately, the manner in which the differential RTZ D/A converter is implemented in the prior art often causes an imbalance between the two individual output voltages. Although the outputs behave well when considered differentially, the two single-ended output voltages are typically not symmetrical with each other and, therefore, can possibly be a hidden source of noise in any application in which the converter is used. Moreover, some applications do not use the differential form of the output signal, but use one single-ended output or the other. In that case, it is imperative that each single-ended output signal is well behaved and not influenced by any asymmetry in the current parking circuitry.

In the prior art, the current parking circuit included two diodes coupled to respective load resistors associated with the data input circuits. In the current parking mode, these diodes draw equal currents and produce equal output voltages, or a differential output of zero. When the converter is switched back to the enabled state and the diodes are switched off, each diode junction capacitance contains a residual charge, which will rapidly dissipate through any available discharge path. Unfortunately, however, only one of the two diodes has a good discharge path, through the circuit that has been enabled by the data signal. The other diode is effectively isolated and discharges more slowly during the transition to the enabled phase. Therefore, there is an inherent imbalance between the two single-ended outputs at the transition back to the enabled phase. Although this imbalance is of less consequence if differential outputs are used, its effects become more pronounced as the current parking periods are made smaller, i.e., at higher frequencies of operation. Accordingly, there is a need for improvement of the prior art one-bit return-to-zero D/A converter architecture. Ideally, what is needed is a converter that provides balanced differential outputs that are not affected by the asymmetrical diode discharge problem described above, such that either of the outputs may be used individually in downstream processing. The present invention satisfies this need.

SUMMARY OF THE INVENTION

The present invention resides in a one-bit return-to-zero digital-to-analog converter that avoids the disadvantages discussed above. Briefly, and in general terms, the invention is embodied in a one-bit return-to-zero digital-to-analog converter, comprising a current source, configured to draw an approximately constant current from a voltage source; a first differential switch, controlled by clock signals to switch current flowing through the current source back and forth between a data signal path that is active during an enabled phase of the clock signals, and a current parking path that is active during a return-to-zero phase of the clock signals; a second differential switch, connected in the data signal path and controlled by data input signals to switch current along one of two alternate paths in the data signal path, to produce data output signals corresponding to the data input signals during the enabled phase of the clock signals; and a current parking circuit, connected in the current parking path and activated by the first differential switch in the return-to-zero phase of the clock signals. Importantly, the current parking circuit is coupled directly to the voltage source independently of the data signal path, thereby avoiding any imbalance resulting from the use of diodes or similar devices that are not completely symmetrical in configuration with the data signal path.

More specifically, in one disclosed embodiment of the invention the current parking circuit comprises a pair of diodes, each coupled through its own load resistor to the voltage source, and both coupled to the first differential switch. In an alternate embodiment, the current parking circuit comprises a single diode coupled through a single load resistor to the voltage source, and coupled to the first differential switch. In another alternate embodiment, the current parking circuit comprises a single load resistor coupled to the voltage source and coupled to the first differential switch.

It will be appreciated from the foregoing summary, that the invention provides a significant advance in the field of digital-to-analog converters of the one-bit, return-to-zero type. In particular, the invention avoids significant disadvantages of conventional circuitry of this type by ensuring that the current parking path is independent of the data signal path, thereby eliminating any potentially harmful imbalance in the circuitry, and any resulting output signal anomalies. Other aspects and advantages of the invention will become apparent from the following more detailed description, taken in conjunction with the accompanying drawings.

DETAILED DESCRIPTION OF THE INVENTION

Figure 1:
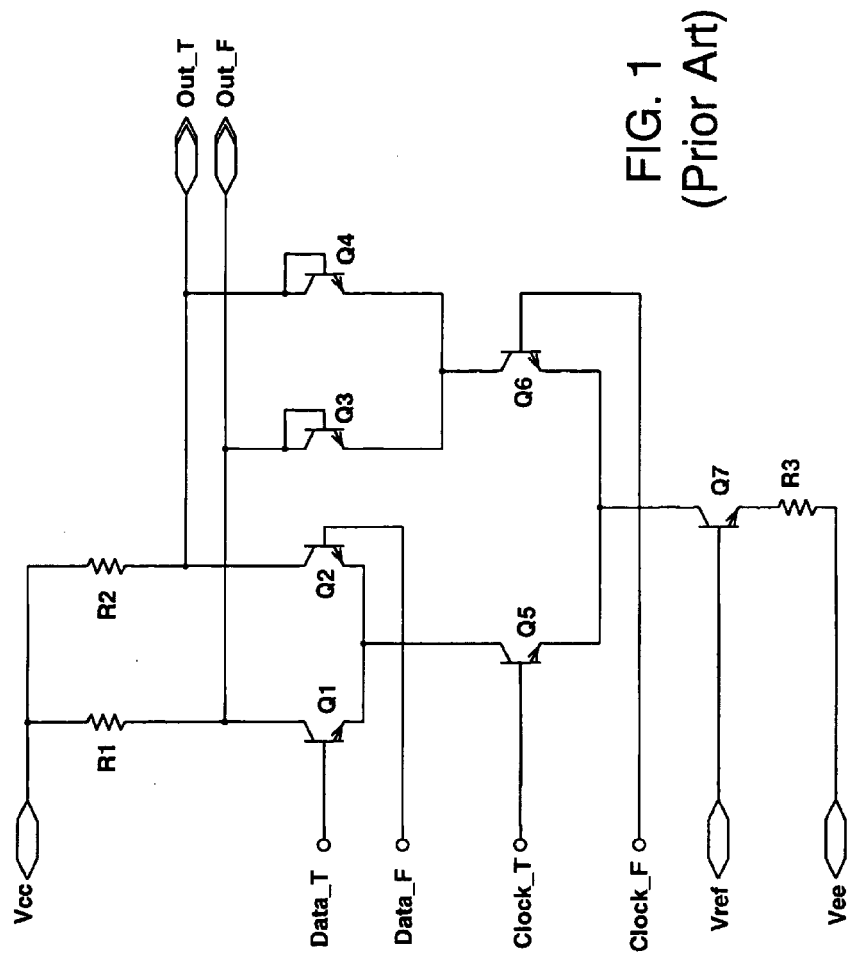
FIG. 1 is a circuit diagram of a one-bit return-to-zero digital-to-analog (D/A) converter of the prior art.

As shown in the drawings for purposes of illustration, the present invention pertains to-digital-to-analog (D/A) converters, and in particular to one-bit differential return-to-zero D/A converters. As mentioned above, one-bit D/A converters are used in a variety of applications, often in conjunction with delta-sigma modulators. Such modulators produce a one-bit digital output, and the one-bit D/A converter converts an output stream from a delta-sigma modulator to a smoothly varying analog output (after filtering). One-bit D/A converters are also used in the feedback loop associated with continuous-time and switched-capacitor delta-sigma analog-to-digital (A/D) converters. One-bit D/A converters may also be used in greater numbers to form N-bit converters, where N is greater than one.

FIG. 1 illustrates the standard technique for implementing a differential one-bit return-to-zero D/A converter. The circuit includes a current source provided by transistor Q7, which has a reference voltage Vref coupled to its base and an emitter voltage Vee coupled to its emitter through a resistor R3. Transistor Q7 draws a constant current from voltage source Vcc (at the top of the drawing) through a path determined by the states of two pairs of transistors located between transistor Q7 and the voltage source Vcc. Transistor pair Q5 and Q6, is toggled back and forth by a differential clock signal, indicated as Clock_T and Clock_F, and determines whether the converter is in an enabled phase, with transistor Q5 conductive, or a current parking phase, with transistor Q6 conductive. Transistor pair Q1 and Q2, which is toggled back and forth by a differential data input signal, indicated as Data_T and Data_F, is connected between transistor Q5 and the voltage source Vcc. In the enabled phase, the data signal determines which one of transistors Q1 and Q2 is conductive, and this in turn determines the state of the output signals Out_T and Out_F. Two additional transistor/diodes Q3 and Q4 are both configured as diodes and are coupled between transistor Q6 and the voltage source Vcc. Thus, transistor/diodes Q3 and Q4 are conductive only when transistor Q6 is conductive, i.e., in the current parking phase.

More specifically, the components in FIG. 1 are connected as follows. The data input signals Data_T and Data_F are coupled to the base terminals of transistors Q1 and Q2, respectively. The emitters of transistors Q1 and Q2 are connected in common to the collector of transistor 05, and the collectors of transistors Q1 and Q2 are coupled to the voltage source Vcc through load resistors R1 and R2, respectively. Differential output signals Out_T and Out_F are derived from connections to the collectors of transistors Q2 and Q1, respectively. By way of example, when transistor Q1 is conductive and transistor Q2 is not, the voltage Vcc is impressed on output Out_T, because there is no voltage drop across load resistor R2, and a lower voltage will be impressed on output Out_F because there is a voltage drop across load resistor R1. When transistor Q2 is conductive, the output voltages will be reversed. Thus, the output signals Out_T and Out_F mirror the states of the input signals Data_T and Data_F, but only in the enabled phase, when transistor Q5 is conductive.

The clock signals Clock_T and Clock_F are coupled to the base terminals of transistors Q5 and Q6, respectively, and the emitters of these transistors are connected in common to the collector of transistor Q7. Therefore, the state of the clock signals determines whether transistor Q5 is conductive or transistor Q6 is conductive. When transistor Q5 is conductive, current flows either though resistor R1 and transistor Q1, or through resistor R2 and transistor 02, as determined by the state of the data input signal.

When transistor Q6 is conductive, current flows through resistor R1 and transistor/diode Q3 and through resistor R2 and transistor/diode Q4. Transistor/diodes Q3 and Q4 have their respective bases and collectors connected together, such that they function as diodes. During the current parking phase, when transistor Q6 is conductive, current flows in equal proportions through transistor/diodes Q3 and Q4, supplied by the voltage source Vcc, through load resistors R1 and R2, respectively. Therefore, the voltage drops across load resistors R1 and R2 will be equal, and the voltages impressed on the output signals Out_T and Out_F will be equal. The differential output in this phase of operation will, therefore, be zero. This achieves the return-to-zero function of the converter.

As mentioned in the background section above, each of the transistor/diodes Q3 and Q4 has an inherent capacitance and retains a residual electrical charge at the end of the current parking phase. The residual charge will dissipate through any available discharge path during the enabled phase, and may not be significant at low frequencies of operation, when both phases are relatively long. Unfortunately, however, the circuit of FIG. 1 is not completely symmetrical because the transistor/diodes Q3 and Q4 do not have an equal opportunity to discharge any residual electrical charge during the enabled phase. For example, if transistor Q1 is conductive during an enabled phase, transistor/diode Q3 is provided with a discharge path through transistor Q1, but transistor/diode Q4 is essentially isolated, since transistor Q2 is not conductive, more slowly discharges its residual charge. This asymmetry in the ability of transistor/diodes Q3 and Q4 to discharge results in an imbalance in output voltage profiles in the vicinity of the transitions from zeroed to enabled. Although the effect is small, it becomes more significant at high frequencies, and is more critical if a single-ended output is used in downstream processing applications.

Figure 2:
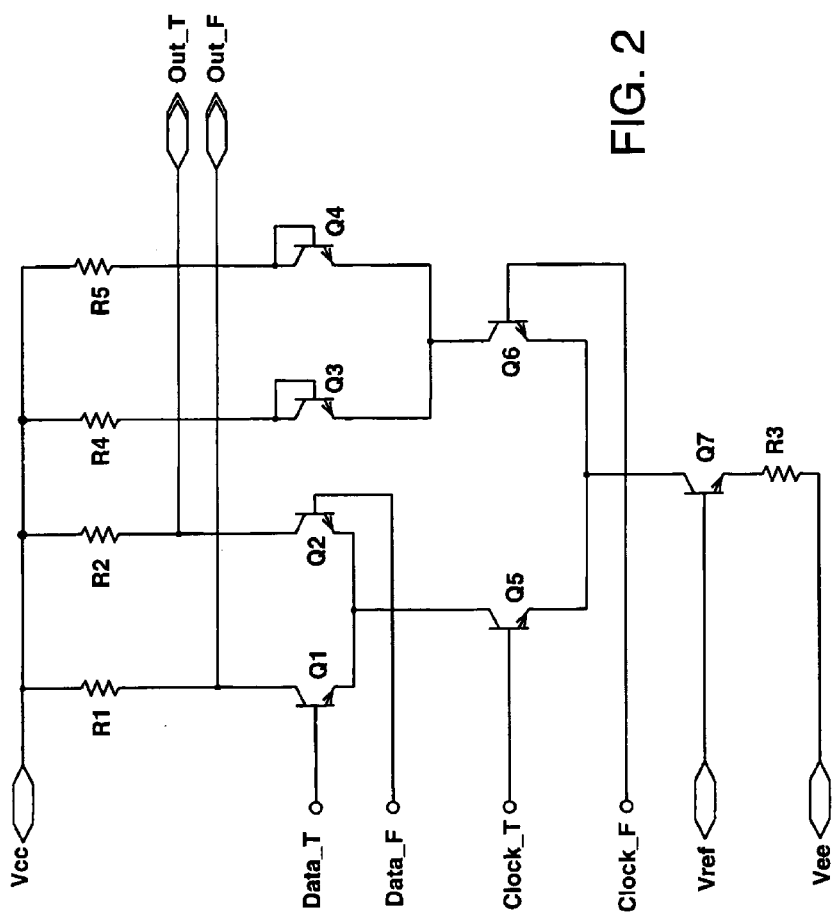
FIG. 2 is a circuit diagram of a one-bit return-to-zero D/A converter in accordance with the present invention.

In accordance with the present invention, the current parking segment of the converter is modified to be independent of the state of the data input signals. As shown in FIG. 2, transistor/diodes Q3 and Q4 are not coupled to the collectors of transistors Q1 and Q2, but are coupled instead through respective load resistors R4 and R5, respectively, to the voltage source Vcc. In the current parking phase of operation, current flows in equal proportions through the two parallel paths comprising resistor R4 and transistor/diode Q3, and resistor R5 and transistor/diode Q4. Since no current flows through load resistors R1 and R2 during the current parking phase, the supply voltage Vcc will be impressed on both output lines Out_T and Out_F, producing a zero differential output signal. Moreover, because these outputs are necessarily equal, either output signal may be used to provide an indication of the D/A converter output. When the circuit is switched to the enabled mode, with transistor Q5 again conductive, either Q1 or Q2 will conduct as determined by the data input signals causing either out_T or out_F to transtion back to a logic low state. Transistor/diodes Q3 and Q4 no longer affect the output signal. Therefore, the circuit is more symmetrical and the output anomalies arising in the prior art circuit of FIG. 1 are no longer present.

Figure 3:
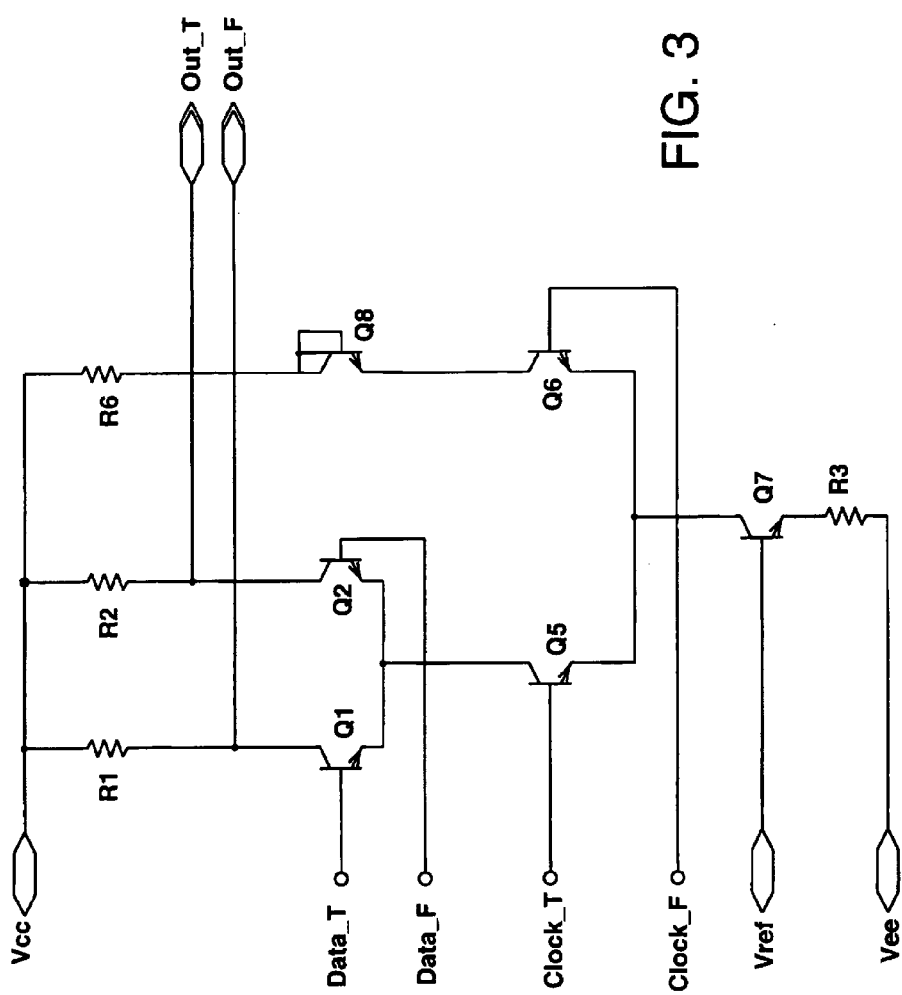
FIG. 3 is a circuit diagram similar to FIG. 2, but showing an alternate embodiment of the invention.

FIG. 3 shows an alternate embodiment of the invention. Instead of a pair of transistor/diodes Q3 and Q4, a single transistor/diode Q8 is connected in series with a single load resistor R6, between the supply voltage Vcc and the collector of transistor Q6. As in the FIG. 2 configuration, because there is no current flowing through load resistor R1 or resistor R2 during the current parking phase the supply voltage Vcc is impressed on both output lines Out_T and Out_F. At the start of the enabled phase, the circuit responds identically to the first configuration.

Figure 4:
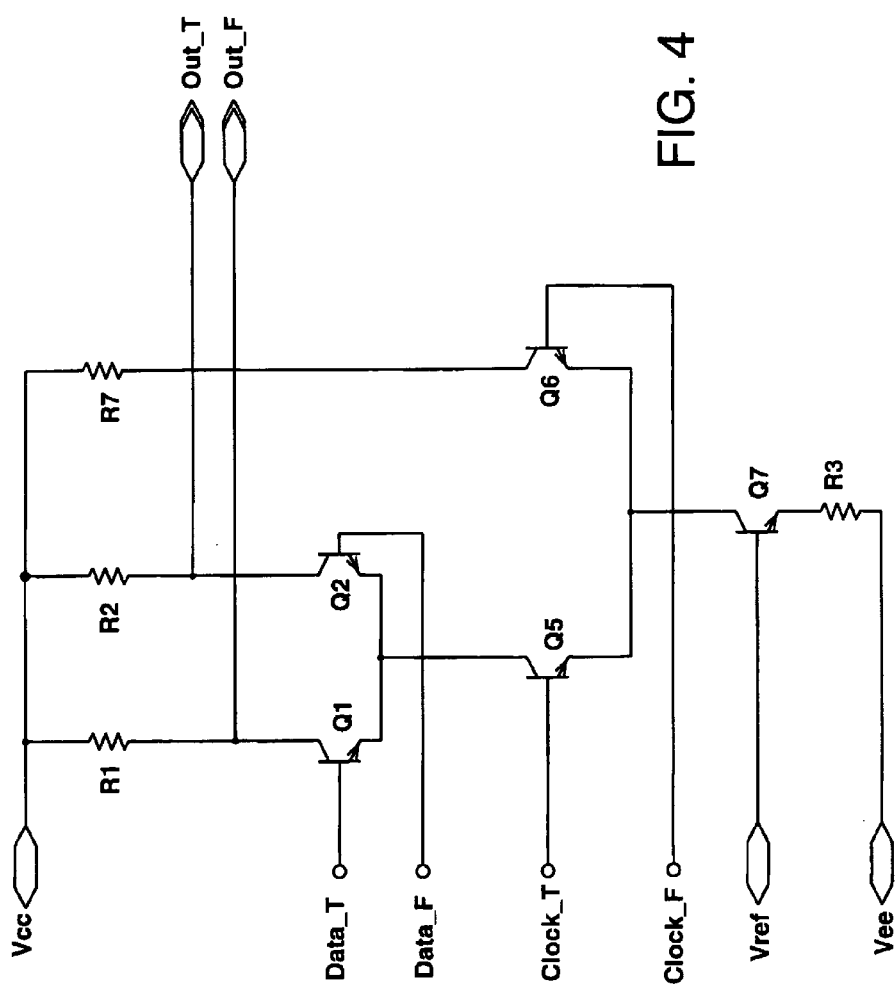
FIG. 4 is a circuit diagram similar to FIG. 2, but showing another alternate embodiment of the invention.

A further simplification of the circuit of FIG. 3 is shown in the alternate embodiment of FIG. 4, in which a single load resistor R7 is connected between the supply voltage Vcc and the collector of transistor Q6. As in the configurations of FIGS. 2 and 3, there is no current flow through resistor R1 or resistor R2 during the current parking phase, and the supply voltage Vcc is impressed on both output lines Out_T and Out_F. At the start of the enabled phase, the circuit responds identically to the first configuration. Although the circuit will funtion identically in all three configurations, the first is better suited for a symmetrical layout.

It will be appreciated from the foregoing that the present invention represents a significant advance in the field of one-bit return-to-zero D/A converters. In particular, the invention overcomes a drawback to the conventional circuitry used for current parking in the D/A converter, and provides an output signal that is not subject to the anomalies inherent in the conventional circuit. It will also be appreciated that, although an embodiment of the invention has been described in detail for purposes of illustration, various modifications may be made without departing from the spirit and scope of the invention. Accordingly, the invention should not be limited except as by the appended claims.

What is claimed is:

1. A one-bit return-to-zero digital-to-analog converter, comprising:

a current source, configured to draw an approximately constant current from a voltage source;

a first differential switch, controlled by clock signals to switch current flowing through the current source back and forth between a data signal path that is active during an enabled phase of the clock signals, and a current parking path that is active during a return-to-zero phase of the clock signals;

a second differential switch, connected in the data signal path and controlled by data input signals to switch current along one of two alternate paths in the data signal path, to produce data output signals corresponding to the data input signals during the enabled phase of the clock signals; and a current parking circuit, connected in the current parking path and activated by the first differential switch in the return-to-zero phase of the clock signals, wherein the current parking circuit is coupled directly to the voltage source independently of the data signal path.

2. A one-bit return-to-zero digital-to-analog converter as defined in claim 1, wherein the current parking circuit comprises:

a pair of diodes, each coupled through its own load resistor to the voltage source, and both coupled to the first differential switch.

3. A one-bit return-to-zero digital-to-analog converter as defined in claim 1, wherein the current parking circuit comprises:

a single diode coupled through a single load resistor to the voltage source, and coupled to the first differential switch.

4. A one-bit return-to-zero digital-to-analog converter as defined in claim 1, wherein the current parking circuit comprises:

a single load resistor coupled to the voltage source and coupled to the first differential switch.

5. A one-bit return-to-zero digital-to-analog converter as defined in claim 1, wherein:

the first differential switch comprises a pair of transistors switched differentially by the clock signals, to route current along one of the data signal path and the current parking path.

6. A one-bit return-to-zero digital-to-analog converter as defined in claim 5, wherein:

the second differential switch comprises a pair of transistors switched differentially by the input data signals, to route current in the data signal path along one of the two alternate paths;

each of the two alternate paths comprises a load resistor coupled to the voltage supply; and the output data signals are derived from the junction points between the load resistors and their respective transistors in the second differential switch.

7. A one-bit return-to-zero digital-to-analog converter as defined in claim 6, wherein the current parking circuit comprises:

a pair of diodes, each coupled through its own load resistor to the voltage source, and both coupled to the first differential switch.

8. A one-bit return-to-zero digital-to-analog converter as defined in claim 6, wherein the current parking circuit comprises:

a single diode coupled through a single load resistor to the voltage source, and coupled to the first differential switch.

9. A one-bit return-to-zero digital-to-analog converter as defined in claim 6, wherein the current parking circuit comprises:

a single load resistor coupled to the voltage source and coupled to the first differential switch.

10. A one-bit return-to-zero digital-to-analog converter, comprising:

a voltage source;

a first current switch, for switching current derived from the voltage source alternately through a data signal path in an enabled phase of operation and through a current parking path during a return-to-zero phase of operation;

a second current switch, for switching current flowing in the data signal path along one of two alternate paths in response to digital data input signals; and a current parking circuit, connected in the current parking path and active only in the return-to-zero phase of operation, wherein the current parking circuit is coupled directly to the voltage source independently of the data signal path.

11. A one-bit return-to-zero digital-to-analog converter as defined in claim 10, wherein the current parking circuit comprises:

a pair of diodes, each coupled through its own load resistor to the voltage source, and both coupled to the first current switch.

12. A one-bit return-to-zero digital-to-analog converter as defined in claim 10, wherein the current parking circuit comprises:

a single diode coupled through a single load resistor to the voltage source, and coupled to the first current switch.

13. A one-bit return-to-zero digital-to-analog converter as defined in claim 10, wherein the current parking circuit comprises:

a single load resistor coupled to the voltage source and coupled to the first current switch.

* * * * *